United States Patent
Cordero et al.

(10) Patent No.: US 10,168,923 B2
(45) Date of Patent: Jan. 1, 2019

(54) COHERENCY MANAGEMENT FOR VOLATILE AND NON-VOLATILE MEMORY IN A THROUGH-SILICON VIA (TSV) MODULE

(71) Applicant: International Business Machines Corporation, Armonk, NY (US)

(72) Inventors: Edgar R. Cordero, Round Rock, TX (US); Kyu-hyoun Kim, Chappaqua, NY (US); Warren E. Maule, Chappaqua, NY (US); Adam J. McPadden, Underhill, VT (US); Anuwat Saetow, Austin, TX (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 102 days.

(21) Appl. No.: 15/138,629

(22) Filed: Apr. 26, 2016

(65) Prior Publication Data

US 2017/0308309 A1    Oct. 26, 2017

(51) Int. Cl.
*G06F 3/06* (2006.01)
*G11C 11/4096* (2006.01)
(Continued)

(52) U.S. Cl.
CPC ............ *G06F 3/0619* (2013.01); *G06F 3/065* (2013.01); *G06F 3/0608* (2013.01);
(Continued)

(58) Field of Classification Search
CPC ...... G06F 3/0619; G06F 3/0608; G06F 3/065; G06F 3/0652; G06F 3/0656; G06F 3/0659; G06F 3/0685; G06F 2201/805; G06F 2201/86; G11C 11/4067; G11C 11/4096; G11C 14/0018
See application file for complete search history.

(56) References Cited

U.S. PATENT DOCUMENTS 4,538,226 A    8/1985    Hori
6,914,814 B2  7/2005    Im et al.
(Continued)

FOREIGN PATENT DOCUMENTS

WO        02033565 A3    4/2002

OTHER PUBLICATIONS

E. R. Cordero, et al.,"Volatile and Non-Volatile Memory in a TSV Module", U.S. Appl. No. 15/138,610, filed Apr. 26, 2016.
(Continued)

*Primary Examiner* — Tracy A Warren
(74) *Attorney, Agent, or Firm* — Cantor Colburn LLP (57) ABSTRACT

An aspect includes coherency management between volatile memory and non-volatile memory in a through-silicon via (TSV) module of a computer system. A plurality of TSV write signals is simultaneously provided to the volatile memory and the non-volatile memory. A plurality of values of the TSV write signals is captured within a buffer of the non-volatile memory corresponding to a data set written to the volatile memory. Storage space is freed within the buffer as the data set corresponding to the values of the TSV write signals stored within the buffer is written to a non-volatile memory array within the non-volatile memory.

11 Claims, 7 Drawing Sheets

(51) Int. Cl.
*G11C 11/406* (2006.01)
*G06F 11/20* (2006.01)
*G11C 14/00* (2006.01)
*G11C 5/04* (2006.01)

(52) U.S. Cl.
CPC .......... *G06F 3/0652* (2013.01); *G06F 3/0656* (2013.01); *G06F 3/0659* (2013.01); *G06F 3/0685* (2013.01); *G06F 11/2015* (2013.01); *G11C 5/04* (2013.01); *G11C 14/0018* (2013.01); *G06F 2201/805* (2013.01); *G06F 2201/86* (2013.01)

(56) References Cited

U.S. PATENT DOCUMENTS

| | | | |
|---|---|---|---|
| 7,492,368 B1 | 2/2009 | Nordquist et al. | |
| 7,613,850 B1 | 11/2009 | Doering et al. | |
| 7,944,764 B1* | 5/2011 | Qawami | G11C 11/005 365/200 |
| 8,250,328 B2 | 8/2012 | Farrell et al. | |
| 8,370,683 B1 | 2/2013 | Ryan et al. | |
| 8,588,010 B2 | 11/2013 | Lee et al. | |
| 2006/0004955 A1* | 1/2006 | Ware | G11C 11/406 711/106 |
| 2006/0020764 A1 | 1/2006 | Kim et al. | |
| 2006/0129767 A1 | 6/2006 | Berenyi et al. | |
| 2010/0110748 A1* | 5/2010 | Best | G06F 12/0638 365/51 |
| 2010/0131708 A1* | 5/2010 | Park | G11C 13/0069 711/115 |
| 2011/0242876 A1* | 10/2011 | Norman | G06F 13/1668 365/148 |
| 2015/0236870 A1 | 8/2015 | Lee et al. | |
| 2017/0220293 A1* | 8/2017 | Kim | G11C 5/06 |

OTHER PUBLICATIONS

List of IBM Patents or Patent Applications Treated as Related; AUS920160058US1, Date Filed: Apr. 26, 2016, p. 1-2.

* cited by examiner

COHERENCY MANAGEMENT FOR VOLATILE AND NON-VOLATILE MEMORY IN A THROUGH-SILICON VIA (TSV) MODULE

BACKGROUND

The present invention relates to computer memory systems, and more specifically, to a through-silicon via (TSV) module that includes volatile and non-volatile memory.

In some computer system applications, non-volatile memory is used to backup and preserve the state of volatile memory during a power loss or interruption. Backup power supplies, such as batteries or super capacitors, are typically used to supply power needed to perform a transfer of the contents of volatile memory to non-volatile memory when primary power is lost. The backup power supplies must be sized to provide electrical power for a sufficient period of time to complete data transfer and storage processes from volatile to non-volatile memory. The use of non-volatile memory for backup purposes can also delay system restart timing, as a sufficient period of time must be allotted for the backup writing process to complete upon a power loss event before attempting to restore values from the non-volatile memory to the volatile memory when primary power is restored. Further, when capturing a backup copy of data to enable recovery, it can be challenging to accurately manage and track which data has been captured and which data has not been captured in the non-volatile memory such that coherency between the volatile and non-volatile memory is maintained.

SUMMARY

According to one embodiment, a method of coherency management between volatile memory and non-volatile memory in a through-silicon via (TSV) module of a computer system is provided. The method includes simultaneously providing a plurality of TSV write signals to the volatile memory and the non-volatile memory. A plurality of values of the TSV write signals is captured within a buffer of the non-volatile memory corresponding to a data set written to the volatile memory. Storage space is freed within the buffer as the data set corresponding to the values of the TSV write signals stored within the buffer is written to a non-volatile memory array within the non-volatile memory.

According to another embodiment, a memory system includes a volatile memory in a through-silicon via module, a non-volatile memory coupled to the volatile memory in the through-silicon via module, and backup control logic. The backup control logic is operable to simultaneously provide a plurality of TSV write signals to the volatile memory and the non-volatile memory. A plurality of values of the TSV write signals is captured within a buffer of the non-volatile memory corresponding to a data set written to the volatile memory. Storage space is freed within the buffer as the data set corresponding to the values of the TSV write signals stored within the buffer is written to a non-volatile memory array within the non-volatile memory.

According to yet another embodiment, a computer program product for coherency management between volatile memory and non-volatile memory in a through-silicon via module of a computer system is provided. The computer program product includes a computer readable storage medium having program instructions embodied therewith. The program instructions are executable by processing circuitry to cause the processing circuitry to simultaneously provide a plurality of TSV write signals to the volatile memory and the non-volatile memory. A plurality of values of the TSV write signals is captured within a buffer of the non-volatile memory corresponding to a data set written to the volatile memory. Storage space is freed within the buffer as the data set corresponding to the values of the TSV write signals stored within the buffer is written to a non-volatile memory array within the non-volatile memory.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein are directed to a computer memory system with a through-silicon via (TSV) module that includes volatile and non-volatile memory. The inclusion of TSVs enables connections between internal signal domains of the volatile and/or non-volatile memory that may not otherwise be accessible using only externally available signal connection points. TSVs in the volatile and non-volatile memory can be interconnected at various locations to enable data to be copied from the volatile memory to the non-volatile memory while the volatile memory is being refreshed. TSVs may also be linked to one or more buses that are externally accessible by a controller to simultaneously provide a plurality of TSV write signals (e.g., address, command, and/or data signals) to the volatile memory and the non-volatile memory. The volatile memory can include one or more dynamic random access memory (DRAM) chips, and the nonvolatile memory includes one or more non-volatile random access memory (NVRAM) chips stacked with the DRAM in a TSV module.

By integrating the DRAM and NVRAM chips into one module and interacting with the data flow of the chips, backup storage of DRAM data to NVRAM can be achieved while maintaining the access times of the DRAM. Coherency between the DRAM data and NVRAM data can be maintained by either simultaneously writing data to both the DRAM and a buffer of the NVRAM or by simultaneously providing write addresses to the DRAM and NVRAM.

When write-address tracking is used, the NVRAM can retain a write address buffer with addresses in the DRAM which have been updated but not yet backed up to NVRAM. Upon a refresh of the DRAM corresponding to a tracked write address, a copy of data being refreshed can be provided from the DRAM to a data buffer of the NVRAM. Upon writing data from the data buffer of the NVRAM to a non-volatile memory array of the NVRAM having an address corresponding to a write address in the write address buffer, an entry corresponding to the write address can be removed/invalidated from the write address buffer. Thus, upon recovery from a loss of power event, stale values in the NVRAM can be identified by examining the write address buffer of the NVRAM.

Figure 1:
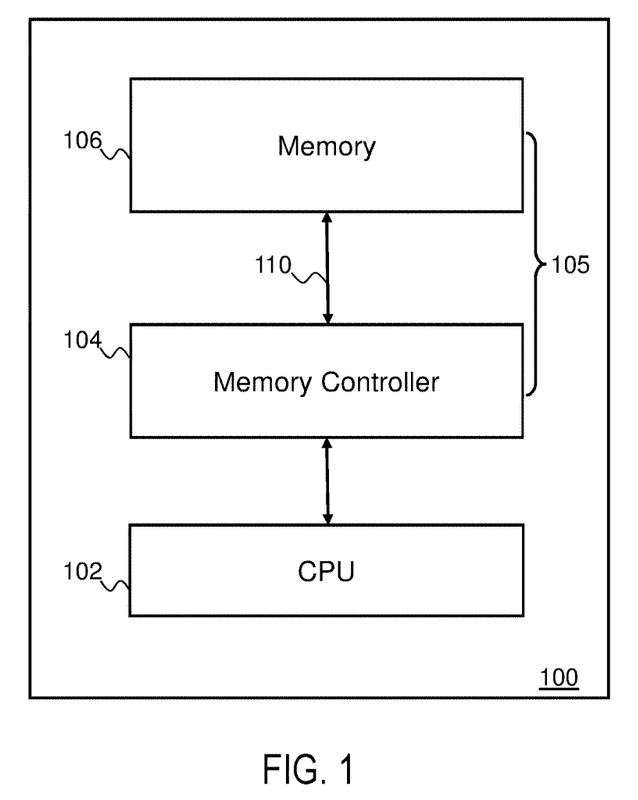
FIG. 1 is a block diagram of an exemplary system according to embodiments of the invention.

FIG. 1 illustrates a block diagram of a system 100, which is a computer system that supports coherency management in accordance with an embodiment. The system 100 depicted in FIG. 1 includes a computer processor 102, memory 106 including multiple memory devices, and a memory controller 104 for reading and storing data in the memory 106 via an interface 110. Collectively, the memory controller 104 and the memory 106 are referred to as a memory system 105. The computer processor 102 and the interface 110 may operate at different voltage levels and frequencies with respect to each other. The computer processor 102 can be a single core or multi-core processor, where each core may have different voltage and/or frequency settings.

In one embodiment the memory controller 104 is coupled to the computer processor 102 and receives read or write requests from the computer processor 102. The memory controller 104 can control signal timing and sequencing, including memory refresh commands on the interface 110.

The system 100 is one example of a configuration that may be utilized to perform the processing described herein. Although the system 100 has been depicted with only a memory 106, memory controller 104, and computer processor 102, it will be understood that other embodiments would also operate in other systems including additional elements, e.g., multiple computers processors 102 and multiple levels of memory 106. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
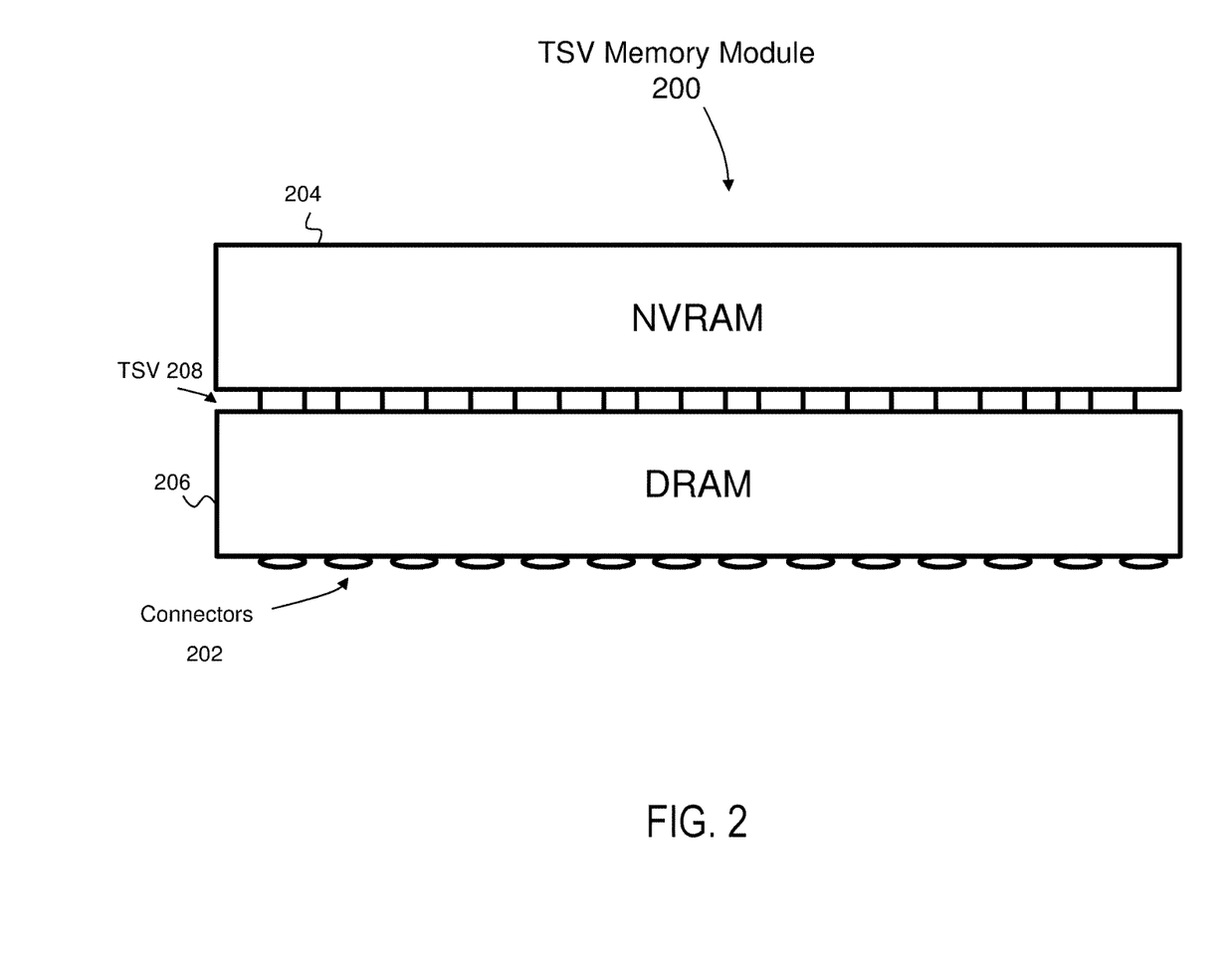
FIG. 2 is a block diagram of a memory device according to an embodiment of the invention.

FIG. 2 is a block diagram of a TSV memory module 200 of the memory 106 in memory system 105 of FIG. 1 according to an embodiment. Although only a single TSV memory module 200 is depicted in FIG. 2, it will be understood that the memory controller 104 can interface with multiple TSV memory modules 200, which may be organized in memory ranks, memory banks, memory cards, or the like. The interface 110 of FIG. 1 can be coupled to connectors 202 of the TSV memory module 200 to propagate power, control, address, and data signals between the memory controller 104 of FIG. 1 and the TSV memory module 200.

In the example of FIG. 2, an NVRAM 204 is a non-volatile memory that provides backup data storage for a DRAM 206. The DRAM 206 is a volatile memory that must be periodically refreshed to retain the state of a memory array within the DRAM 206. Memory refresh cycles can be controlled by the memory controller 104 of FIG. 1, or the DRAM 206 may support self-timed refreshes. In an alternate embodiment, control circuitry for initiating memory refreshes can be located elsewhere, such as a dedicated controller (not depicted) within the TVM memory module 200. TSVs 208 provide a signal path to support backup and restore operations between the NVRAM 204 and the DRAM 206. A portion of the TSVs 208 may be accessible through connectors 202 such that the memory controller 104 can directly access the NVRAM 204 and/or provide shared signals simultaneously to both the NVRAM 204 and the DRAM 206. A subset of the connectors 202 may only be routed to the DRAM 206. Further, a subset of the TSVs 208 connected between the NVRAM 204 and the DRAM 206 may not be accessible through connectors 202 for internal data transfer between the NVRAM 204 and the DRAM 206.

Figure 3:
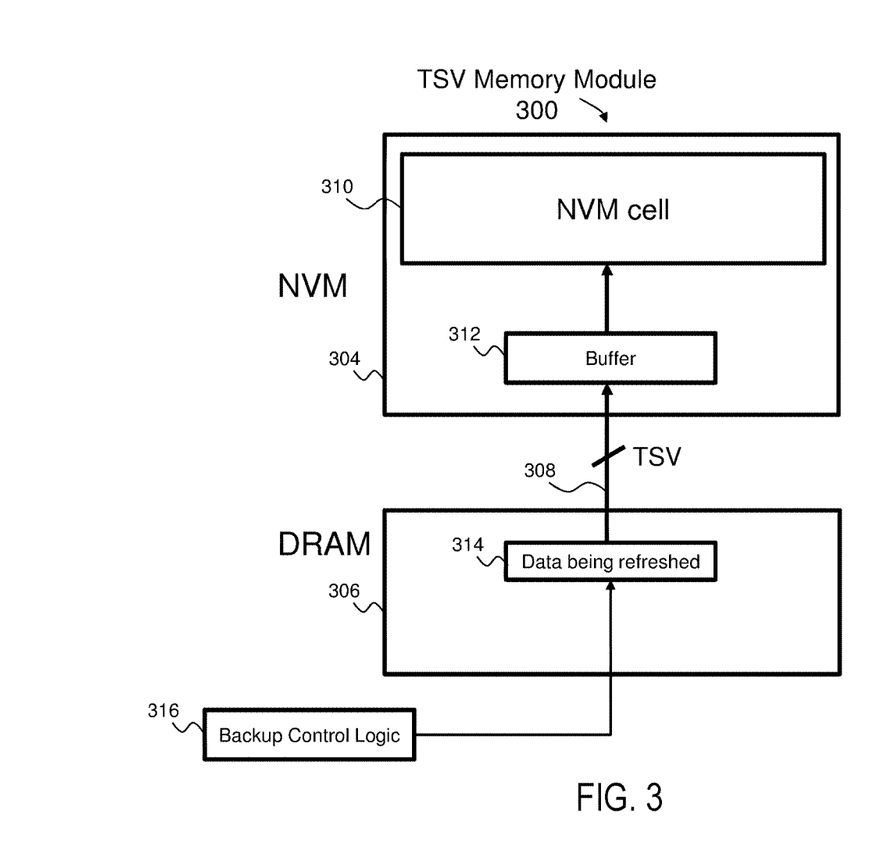
FIG. 3 is a block diagram of a memory device according to another embodiment of the invention.

FIG. 3 is another example of a TSV memory module 300, where non-volatile memory (NVM) 304 is coupled to DRAM 306 using TSVs 308 in a stacked package. The TSV memory module 300 is another example of memory 106 in the memory system 105 of FIG. 1. The NVM 304 can be any type of non-volatile memory that includes a plurality of NVM cells 310 that retain state values upon a loss of power. Multiple NVM cells 310 can form sub-arrays of a non-volatile memory array within the NVM 304. The contents of DRAM 306 are not retained when power is lost. In some embodiments, the TSV memory module 300 includes a buffer 312 that temporarily stores a copy of data being refreshed 314 from DRAM 306. The buffer 312 can be implemented as a non-volatile structure or a volatile structure using latches, a register array, dynamic RAM and/or static RAM. The buffer 312 can be sized to match an expected size of the data being refreshed 314 over one or more memory refresh periods of DRAM 306. Data captured in the buffer 312 can be written to one or more of the NVM cells 310 between refresh cycles of the DRAM 306 while contents of the DRAM 306 is being accessed or updated by the memory controller 104 of FIG. 1.

Backup control logic 316 can be embodied in processing circuitry in the memory controller 104 and/or as part of the TSV memory module 300 to control copying of the data being refreshed 314 from DRAM 306 to NVM 304 during a refresh cycle and/or simultaneous writes to the NVM 304 and the DRAM 306. The backup control logic 316 may also control the writing of data from the buffer 312 to one or more NVM cells 310. As part of the copying and writing of data from DRAM 306 to NVM 304, the backup control logic 316 may perform comparisons between the contents of the one or more NVM cells 310 and the data being refreshed 314 (e.g., as captured in buffer 312) and only make updates to the one or more NVM cells 310 if a difference is detected. Although depicted as a single block, the backup control logic 316 can be distributed between multiple locations, e.g., partially implemented within the memory controller 104, NVM 304, DRAM 306, and/or elsewhere within system 100 of FIG. 1.

Figure 4:
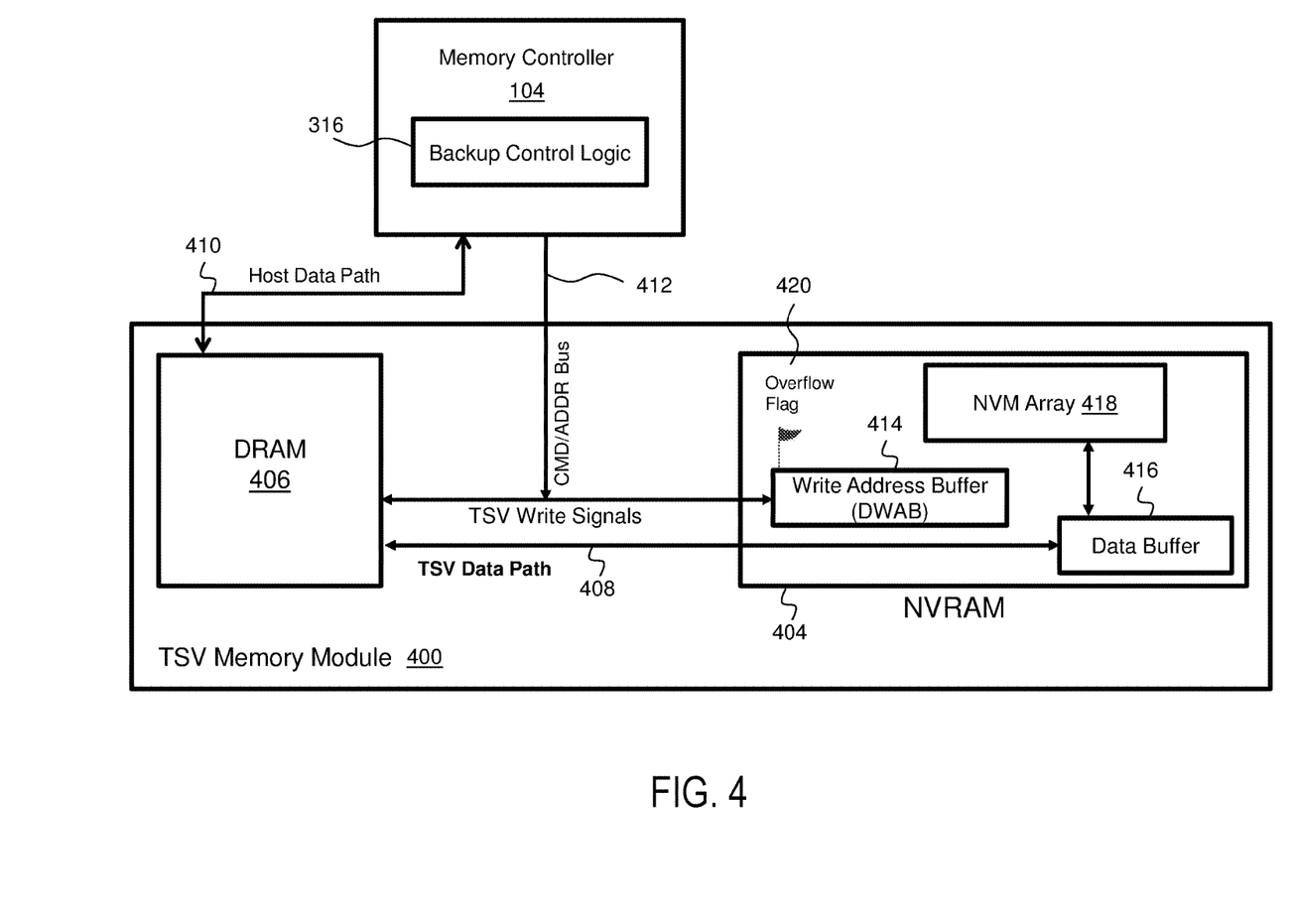
FIG. 4 is a block diagram of a memory device according to another embodiment of the invention.

FIG. 4 is another example of a TSV memory module 400, where non-volatile memory (NVRAM) 404 is coupled to volatile memory (DRAM) 406 using TSVs 408 and can be in a stacked package as depicted in FIGS. 2 and 3. In the example of FIG. 4, a host data path 410 and a command/address bus 412 collectively form a portion of interface 110 of FIG. 1. The host data path 410 can provide a read/write data interface between the memory controller 104 and DRAM 406. The command/address bus 412 can include TSVs between the NVRAM 404 and DRAM 406 to support simultaneously providing write addresses to both the NVRAM 404 and DRAM 406 as TSV write signals. A write address buffer 414 in the NVRAM 404 is a buffer that can capture write addresses as values of the TSV write signals from command/address bus 412. During a refresh cycle of the DRAM 406, data is copied from the DRAM 406 to a data buffer 416 over a data path on TSVs 408. Addresses of data copied into the data buffer 416 are compared with the write addresses in the write address buffer 414. One or more of the write addresses are removed from the write address buffer 414 based on determining that corresponding data in the data buffer 416 has been written to a non-volatile memory array 418 within the NVRAM 404 thereby freeing storage space within the write address buffer 414 as the data set corresponding to the values of the TSV write signals stored within the write address buffer 414 is written to the non-volatile memory array 418. In other words, the write address buffer 414 tracks stale data in the non-volatile memory array 418 based on write addresses observed on the command/address bus 412, and write address entries in the write address buffer 414 are removed (i.e., no longer stale) as the updated data is copied from the DRAM 406 to the data buffer 416 and written to the non-volatile memory array 418. All or a portion of the copying and comparing can be performed by backup control logic 316 within the memory controller 104 and/or located elsewhere (e.g., within the TSV memory module 400).

The write address buffer 414 can be implemented as a non-volatile buffer to retain an indication of stale data locations on a loss of power event. Upon system restart after a loss of power event, values from the non-volatile memory array 418 can be copied to the DRAM 406 to restore the system state. The backup control logic 316 can interrogate the write address buffer 414 to determine which locations in the DRAM 406 are stale and need to be updated after data captured in the non-volatile memory array 418 is written back to DRAM 406.

To manage traffic flow in the NVRAM 404, the write address buffer 414 may have an overflow flag 420 that is set upon filling the write address buffer 414. If the write duty cycle exceeds the ability of the NVRAM 404 to buffer all of the write addresses before corresponding data values are received at the data buffer 416 and stored in the non-volatile memory array 418, the overflow flag 420 may trigger one or more events to mitigate reduced backup capabilities. For instance, writes occurring to the DRAM 406 while the overflow flag 420 is set may be invalidated or blocked until sufficient space is freed in the write address buffer 414. The overflow flag 420 may be polled or drive an interrupt/exception through the backup control logic 316 such that the memory controller 104 and/or computer processor 102 of FIG. 1 can apply a desired reaction for the overflow condition. For instance, if the overflow flag 420 is set, the memory controller 104 can suspend further writes for a full chip refresh period of the DRAM 406 to ensure that no stale data remains in the NVRAM 404, thus fully clearing out the write address buffer 414. The overflow flag 420 can be cleared upon freeing storage space within the write address buffer 414.

Figure 5:
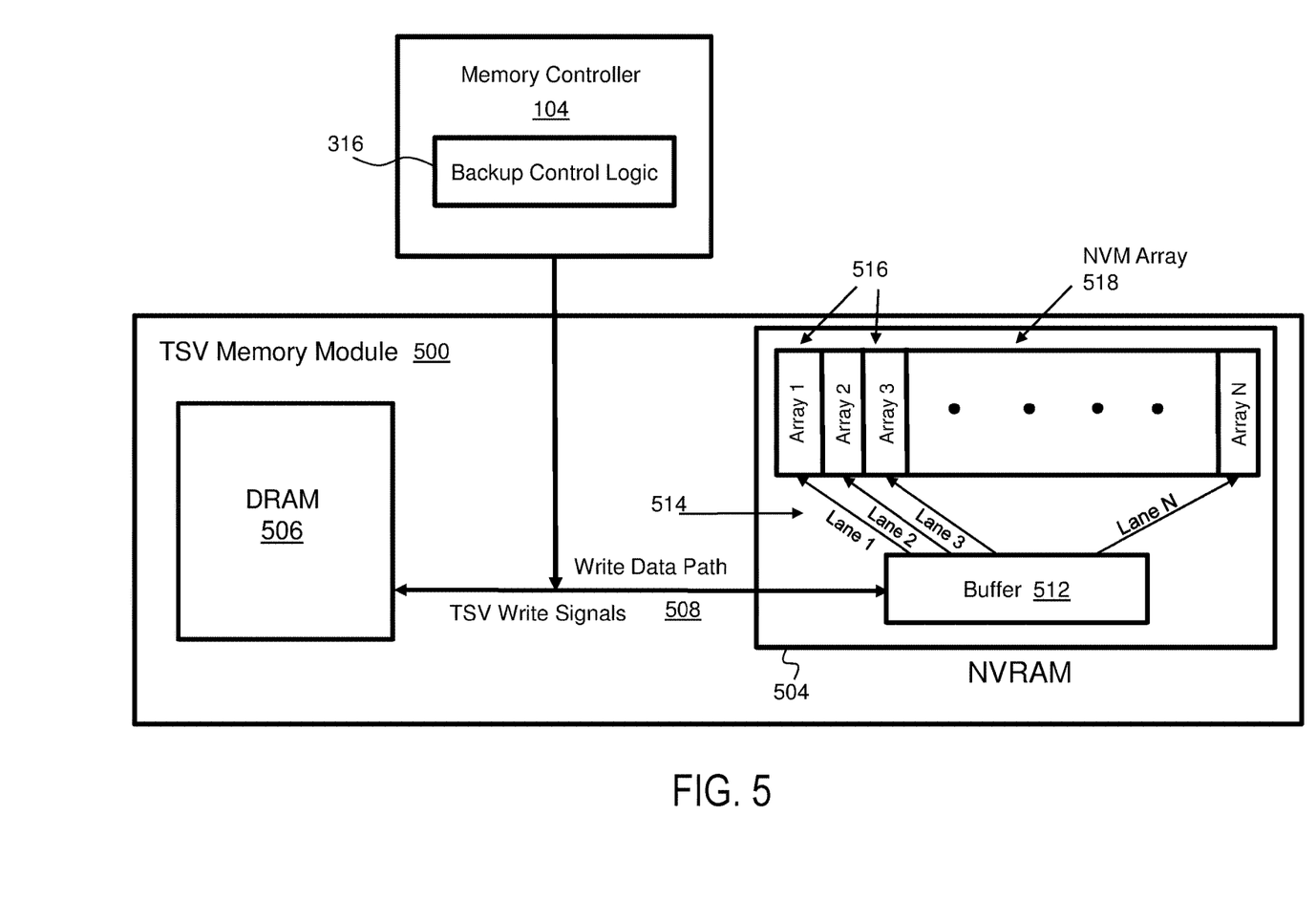
FIG. 5 is a block diagram of a memory device according to another embodiment of the invention.

TSV memory module 500 of FIG. 5 is another example of memory 106 in the memory system 105 of FIG. 1. The TSV memory module 500 and can be embodied in a stacked package as depicted in FIGS. 2 and 3. In FIG. 5, TSVs 508 connect DRAM 506 and NVRAM 504 as a write data path to simultaneously provide a plurality of TSV write signals from the memory controller 104 to both the DRAM 506 and the NVRAM 504. A plurality of values of the TSV write signals is captured within buffer 512 of the NVRAM 504 corresponding to a data set written to the DRAM 506. The values of TSV write signals include the data values in the data set written to the DRAM 506. In other words, both the DRAM 506 and NVRAM 504 receive the same write data at the same time, which can be managed by backup control logic 316. Storage space within the buffer 512 is freed as the data set corresponding to the values of the TSV write signals stored within the buffer 512 is written to a non-volatile memory array 518 within the NVRAM 504. Data values from the buffer 512 can be written in a deterministic order staggered over a plurality of lanes 514 to two or more sub-arrays 516 of the non-volatile memory array 518 in the NVRAM 504. For instance, if the write latency is longer for the NVRAM 504 than DRAM 506, multiple lanes 514 can be used to store different groups of data values in parallel to separate sub-arrays 516. If the storage capacity of the NVRAM 504 is much larger than the DRAM 506, staggering storage to different sub-arrays 516 can be used to handle extended write times in the NVRAM 504 while avoiding stale data.

All or a portion of the writing of data can be performed by backup control logic 316 within the memory controller 104 and/or located elsewhere (e.g., within the TSV memory module 500). Upon system restart after a loss of power event, values from the non-volatile memory array 518 can be copied to the DRAM 506 to restore the system state as controlled, for example, by backup control logic 316.

Figure 6:
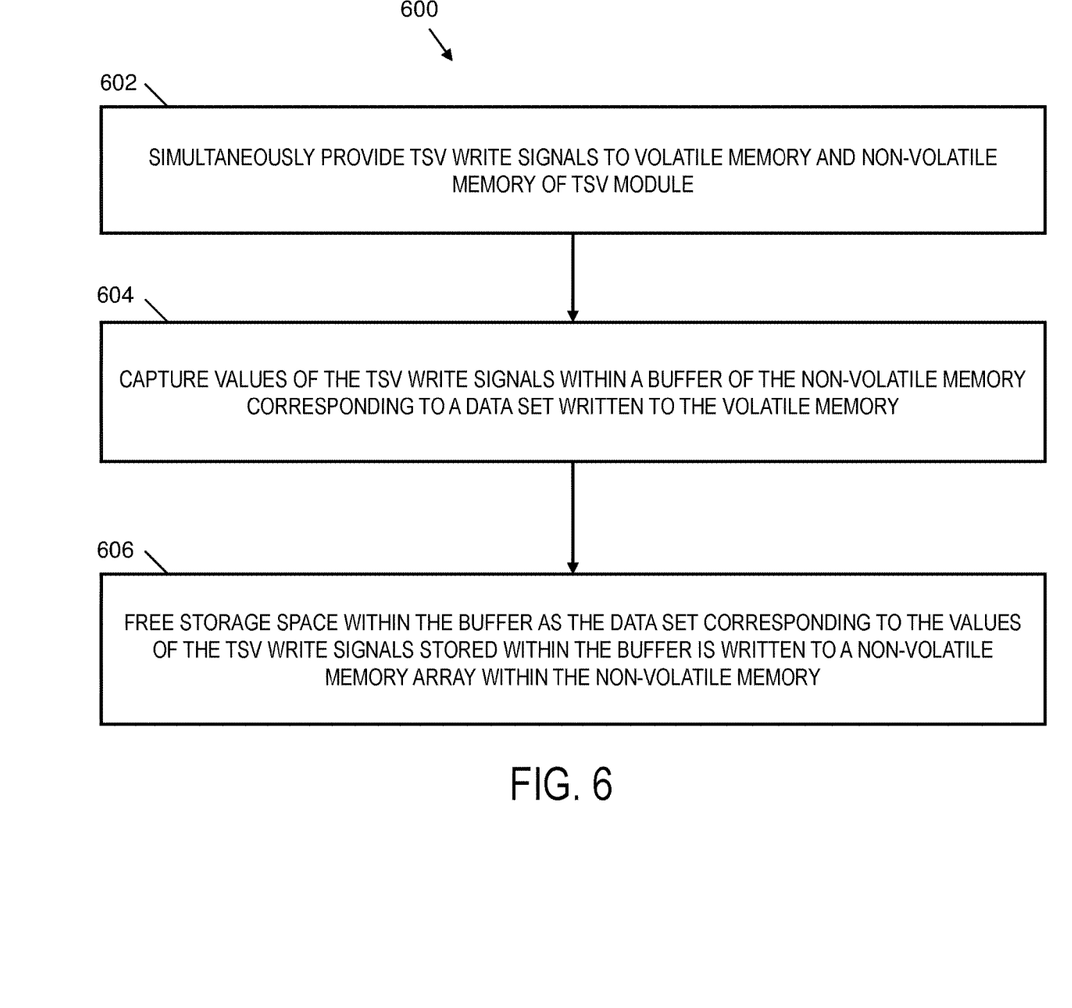
FIG. 6 is a process flow according to an embodiment of the invention.

FIG. 6 is a process flow of a method 600 according to an embodiment. The method 600 can be performed by various elements of the system 100 of FIG. 1, such as the memory system 105 of FIG. 1, and is described in reference to FIGS. 1-5. Although a particular order of blocks is depicted and described with respect to FIG. 6, it will be understood that the order can be changed, and the blocks may be combined or further subdivided. For purposes of explanation, the method 600 is described with respect to the TSV memory modules 400 and 500 but can be implemented in any of the TSV memory module configurations as described herein.

At block 602, memory controller 104 can simultaneously provide a plurality of TSV write signals to the DRAM 406, 506 and the NVRAM 404, 504 on command/address bus 412 or TSVs 508. At block 604, a plurality of values of the TSV write signals is captured within a buffer 414, 512 of the NVRAM 404, 504 corresponding to a data set written to the DRAM 406, 506. In some embodiments, the values of the TSV write signals are write addresses (e.g., in write address buffer 414) while in other embodiments the values of the TSV write signals are the same data values (e.g., in buffer 512) as written to the DRAM 506. At block 606, storage space within the buffer 414, 512 is freed as the data set corresponding to the values of the TSV write signals stored within the buffer 414, 512 is written to a non-volatile memory array 418, 518 within the NVRAM 404, 504.

Figure 7:
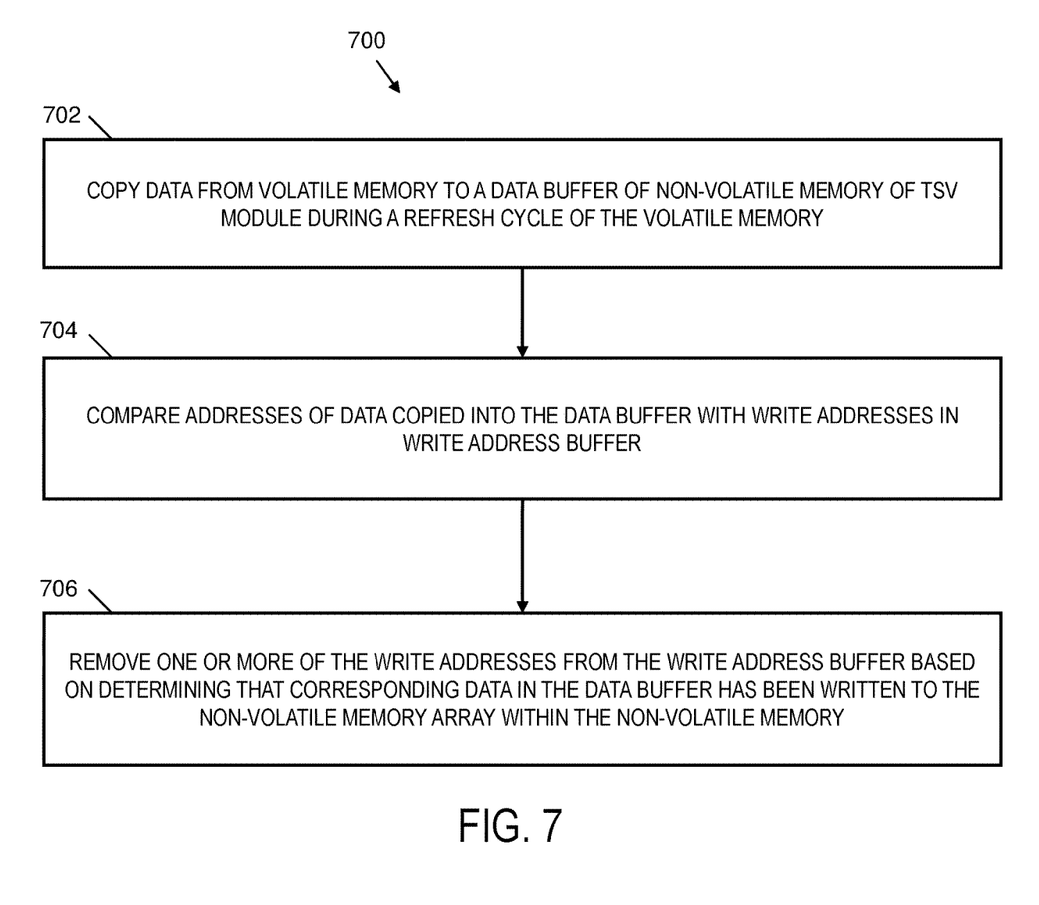
FIG. 7 is a process flow according to another embodiment of the invention.

When embodied in TSV memory module 400 of FIG. 4, process 700 of FIG. 7 may also be performed in conjunction with the process 600 of FIG. 6 to transfer data from the DRAM 406 to NVRAM 404 for backup storage while maintaining coherency. At block 702, data is copied from the DRAM 406 to data buffer 416 of the NVRAM 404 during a refresh cycle of the DRAM 406. Copying of data can be controlled by the backup control logic 316 in real time while a refresh cycle is active for the DRAM 406. Copying of the data from the DRAM 406 to the NVRAM 404 can be performed by transferring the data across a plurality of TSVs 408 interconnected between the DRAM 406 and the NVRAM 404 within the TSV memory module 400.

At block 704, addresses of data copied into the data buffer 416 can be compared with the write addresses in the write address buffer 414. At block 706, one or more of the write addresses from the write address buffer 414 can be removed based on determining that corresponding data in the data buffer 416 has been written to the non-volatile memory array 418 within the NVRAM 404. In some embodiments, data is written to the non-volatile memory array 418 prior to a next refresh cycle of the DRAM 406. Using the data buffer 416 provides a margin for slower write timing of the non-volatile memory array 418 to be accommodated while also keeping the DRAM 406 available to read/write requests from the memory controller 104 during non-refresh times.

Technical effects and benefits include maintaining coherency between DRAM and NVRAM in a TSV memory module. Persistence of DRAM array contents can be achieved without directly experiencing the typical performance limitations of NVRAM. The need for a backup power supply for memory persistence can be eliminated in some embodiments by performing backup operations in real time, and thus may provide a more reliable and less complicated solution.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of coherency management between a volatile memory and a non-volatile memory in a through-silicon via (TSV) module of a computer system, the method comprising:
   simultaneously providing a plurality of TSV write signals on a command and address bus from a memory controller to the volatile memory and the non-volatile memory, wherein the memory controller is operably coupled to the volatile memory by a host data path;
   capturing a plurality of values of the TSV write signals within a write address buffer of the non-volatile memory corresponding to a first data set written to the volatile memory, wherein the plurality of values of the TSV write signals comprise write addresses;
   copying a second data set from the volatile memory to a data buffer of the non-volatile memory during a refresh cycle that refreshes the second data set in the volatile memory, wherein the copying comprises a data transfer across a TSV data path operably coupled between the volatile memory and the non-volatile memory;
   comparing addresses of the second data set copied into the data buffer with the write addresses in the write address buffer corresponding to the first data set; and
   removing one or more of the write addresses from the write address buffer based on writing one or more corresponding data values of the second data set from the data buffer to a non-volatile memory array within the non-volatile memory.

2. The method according to claim 1, further comprising:
   retaining the write addresses in the write address buffer on a power loss event of the TSV module.

3. The method according to claim 1, further comprising:
   setting an overflow flag upon filling the write address buffer; and
   clearing the overflow flag upon freeing storage space within the write address buffer.

4. The method according to claim 1, wherein the volatile memory is dynamic random access memory, the non-volatile memory is non-volatile random access memory, and the through-silicon via module comprises a stacked package connecting a plurality of through-silicon vias between the volatile memory and the non-volatile memory.

5. A memory system comprising:
   a volatile memory in a through-silicon via (TSV) module;
   a non-volatile memory coupled to the volatile memory by a TSV data path in the TSV module; and
   a memory controller operably coupled to the non-volatile memory by a command and address bus and operably coupled to the volatile memory by a host data path and the command and address bus, the memory controller comprising backup control logic operable to simultaneously provide a plurality of TSV write signals on the command and address bus from the memory controller to the volatile memory and the non-volatile memory, wherein a plurality of values of the TSV write signals comprising write addresses is captured within a write address buffer of the non-volatile memory corresponding to a first data set written to the volatile memory, a second data set is copied as a data transfer across the TSV data path from the volatile memory to a data buffer of the non-volatile memory during a refresh cycle that refreshes the second data set in the volatile memory, addresses of the second data set copied into the data buffer are compared with the write addresses in the write address buffer corresponding to the first data set, and one or more of the write addresses are removed from the write address buffer based on writing one or more corresponding data values of the second data set from the data buffer to a non-volatile memory array within the non-volatile memory.

6. The memory system according to claim 5, wherein the write addresses in the write address buffer are retained on a power loss event of the TSV module.

7. The memory system according to claim 5, wherein an overflow flag is set upon filling the write address buffer, and the overflow flag is cleared upon freeing storage space within the write address buffer.

8. The memory system according to claim 5, wherein the volatile memory is dynamic random access memory, the non-volatile memory is non-volatile random access memory, and the through-silicon via module comprises a stacked package connecting a plurality of through-silicon vias between the volatile memory and the non-volatile memory.

9. A computer program product for coherency management between volatile memory and non-volatile memory in a through-silicon via (TSV) module of a computer system, the computer program product comprising a computer readable storage medium having program instructions embodied therewith, the program instructions executable by processing circuitry to cause the processing circuitry to:
- simultaneously provide a plurality of TSV write signals on a command and address bus from a memory controller to the volatile memory and the non-volatile memory, wherein the memory controller is operably coupled to the volatile memory by a host data path;
- capture a plurality of values of the TSV write signals within a write address buffer of the non-volatile memory corresponding to a first data set written to the volatile memory, wherein the plurality of values of the TSV write signals comprise write addresses;
- copy a second data set from the volatile memory to a data buffer of the non-volatile memory during a refresh cycle that refreshes the second data set in the volatile memory, wherein the copy comprises a data transfer across a TSV data path operably coupled between the volatile memory and the non-volatile memory;
- compare addresses of the second data set copied into the data buffer with the write addresses in the write address buffer corresponding to the first data set; and
- remove one or more of the write addresses from the write address buffer based on writing one or more corresponding data values of the second data set from the data buffer to a non-volatile memory array within the non-volatile memory.

10. The computer program product according to claim 9, wherein the write addresses in the write address buffer are retained on a power loss event of the TSV module.

11. The computer program product according to claim 9, wherein an overflow flag is set upon filling the write address buffer, and the overflow flag is cleared upon freeing storage space within the write address buffer.

* * * * *